United States Patent [19]

Park

[11] Patent Number: 5,488,580
[45] Date of Patent: Jan. 30, 1996

[54] SEMICONDUCTOR INTEGRATED CIRCUIT FOR OUTPUTTING DATA WITH A HIGH RELIABILITY

[75] Inventor: Soon-Kyu Park, Cheonahn, Rep. of Korea

[73] Assignee: Samsung Electronics Co., Ltd., Suwon, Rep. of Korea

[21] Appl. No.: 241,855

[22] Filed: May 12, 1994

[30] Foreign Application Priority Data

May 12, 1993 [KR] Rep. of Korea ................... 1993-8145

[51] Int. Cl.⁶ ..................................................... G11C 7/00
[52] U.S. Cl. ............................... 365/189.05; 365/189.01; 365/193; 365/194
[58] Field of Search ......................... 365/189.05, 189.01, 365/193, 194

[56] References Cited

U.S. PATENT DOCUMENTS

| | | | |
|---|---|---|---|
| 3,969,706 | 7/1976 | Proebsting et al. ................. | 365/193 |
| 4,841,488 | 6/1989 | Sanada ................................. | 365/194 |
| 4,905,195 | 2/1990 | Fukuda et al. ....................... | 365/189.05 |
| 4,970,693 | 11/1990 | Nozaki et al. ..................... | 365/189.05 X |
| 5,003,510 | 3/1991 | Kamisaki ............................ | 365/189.01 |
| 5,155,705 | 10/1992 | Goto et al. ......................... | 365/194 X |
| 5,323,355 | 6/1994 | Kato ................................... | 365/193 X |

*Primary Examiner*—David C. Nelms
*Assistant Examiner*—Son Dinh
*Attorney, Agent, or Firm*—Cushman Darby & Cushman

[57] ABSTRACT

A semiconductor integrated memory circuit which extends the time that reliable effective data is output by a data output buffer. The circuit includes a switching device operated by a control signal which is determined according to the states of a row address strobe signal and a column address strobe signal. The switching device is conductive when the column address strobe signal is in an active state, and the switching device is nonconductive when the column address strobe signal is in a precharge state, so that effective data is output by the data output buffer until the column address strobe signal becomes active in the next data read cycle.

9 Claims, 4 Drawing Sheets

5,488,580

SEMICONDUCTOR INTEGRATED CIRCUIT FOR OUTPUTTING DATA WITH A HIGH RELIABILITY

FIELD OF THE INVENTION

The present invention relates to a semiconductor integrated memory circuit and more particularly to a memory circuit which extends the time that desired memory data is output.

BACKGROUND OF THE INVENTION

The capacity and the density of semiconductor integrated memory circuits have been greatly increased; however, the data processing speed of semiconductor integrated memory circuits has not been able to keep pace with the increases in system processing speed. In a conventional semiconductor integrated circuit, when a column address strobe signal CAS is at a precharge level the data output is at a high impedance state. To achieve high speed data access, efforts have been made to reduce the time required for maintaining the high impedance state during data output. There has been proposed a fast page mode. If the fast page mode operates more rapidly in the semiconductor integrated circuit, the time for which effective data is outputted and maintained is also relatively shortened. In such an arrangement, a high impedance state may occur between first effective data and second effective data when sampling the effective data in a system, and an error may occur due to the reduction of time in which the effective data is output.

FIG. 1 is a timing diagram showing a conventional data access operation in a typical dynamic random access memory (DRAM) product, such as model KMM591000AN of the Samsung Electronics company. A row address is latched at the falling edge of a row address strobe signal RAS, and a word line corresponding to the row address is selected. Data stored in memory cells having gates connected to the selected word line is output to each corresponding bit line and is sensed by a bit line sense amplifier. Upon the completion of the sensing operation, a data received signal φRCD is enabled.

Thereafter, desired data is selected by a column address latched at the falling edge of a column address strobe signal CAS. The selected data is transmitted to a data input/output line via a column gate. The desired data is then amplified by an input/output sense amplifier formed on the data input/output line and output to a data output buffer. The data in the data input/output buffer is provided to the exterior of the chip under the control of a data output buffer enable signal φTRST. As illustrated in FIG. 1, when the column address strobe signal CAS is at a precharge state (the logic high state), the data output Dout goes to a high impedance state. In the next cycle, cell data selected by a new column address COL2 is outputted to the exterior of a chip through the same operation described above, and the operation course occurring after data output is the same as discussed above.

As illustrated in FIG. 1, the data output Dout is at a high impedance state each time the column address strobe signal CAS goes to a precharge state. As a result, the time for maintaining the output state of effective data must be limited to the active interval of the column address strobe signal CAS. If the active interval of the column address strobe signal CAS is shortened the time for maintaining the output state of the effective data is also shortened. In the fast page mode previously discussed, the time for maintaining the output state of the effective data is severely reduced. Therefore, it is difficult to ensure that a system will achieve a safe sampling of the desired data.

SUMMARY OF THE INVENTION

It is therefore an object of the present invention to provide a semiconductor integrated circuit capable of outputting reliable desired data.

It is another object of the present invention to provide a semiconductor integrated circuit which ensures accurate sampling of desired data.

It is a further object of the present invention to provide a semiconductor integrated circuit which extends the time for maintaining the output of desired data, even during a fast data output operation mode.

It is still another object of the present invention to provide a semiconductor integrated circuit which extends the time for outputting desired data via a data output buffer when a column address strobe signal is in a precharge state.

It is a further object of the present invention to provide a semiconductor integrated circuit which extends the output interval of desired data, wherein a data output buffer continues to be driven without regard to the state of the column address strobe signal under a fast page mode.

It is still another object of the present invention to provide a method for extending data output of a semiconductor integrated circuit capable of extending the output of desired data, wherein a data output buffer continues to be driven without regard to the state of the column address strobe signal under a fast page mode.

To achieve these objects and other advantages, the present invention is directed to a semiconductor integrated circuit in which memory cell data is isolated from a data output buffer when a column address strobe signal goes to a precharge state from an active state, and in which a data output time is extended by driving the data output buffer without regard to the state of the column address strobe signal.

The present invention also provides for a method for extending data output of a semiconductor integrated circuit in which desired memory cell data is isolated from a data output buffer, and the input to the data output buffer during a non-effective column address is cut-off, when the column address strobe signal goes to a precharge state from an active state. The data output interval is extended by driving the data output buffer without regard to the state of the column address strobe signal.

BRIEF DESCRIPTION OF THE DRAWINGS

The above and other objects, features, and advantages of the present invention will be better understood by reading the following detailed description of the invention, taken in conjunction with the accompanying drawings, wherein.

DETAILED DESCRIPTION OF PRESENTLY PREFERRED EMBODIMENTS

Figure 1:
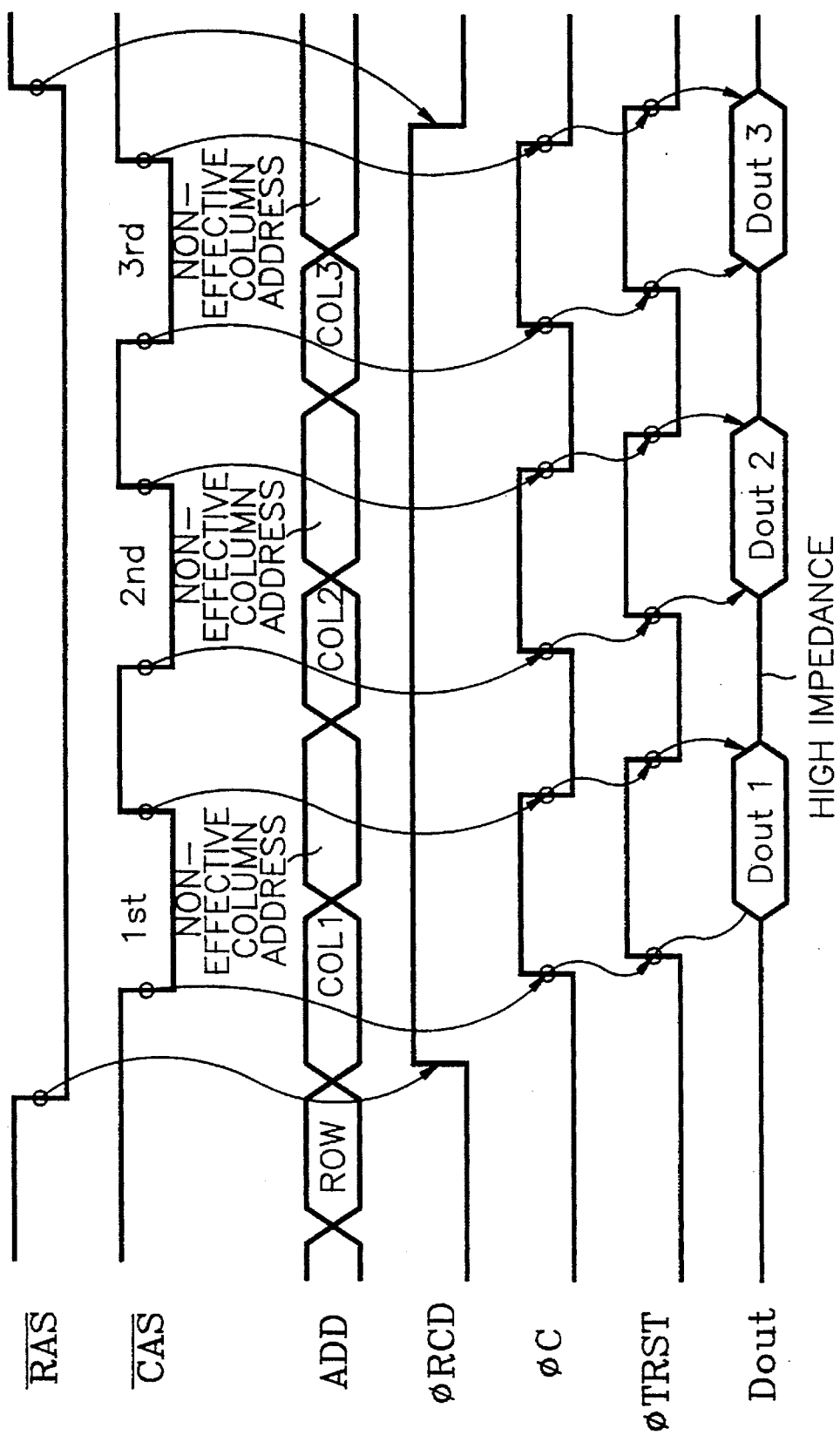
FIG. 1 is an operational timing diagram showing a data output process according to the prior art.
Figure 2:
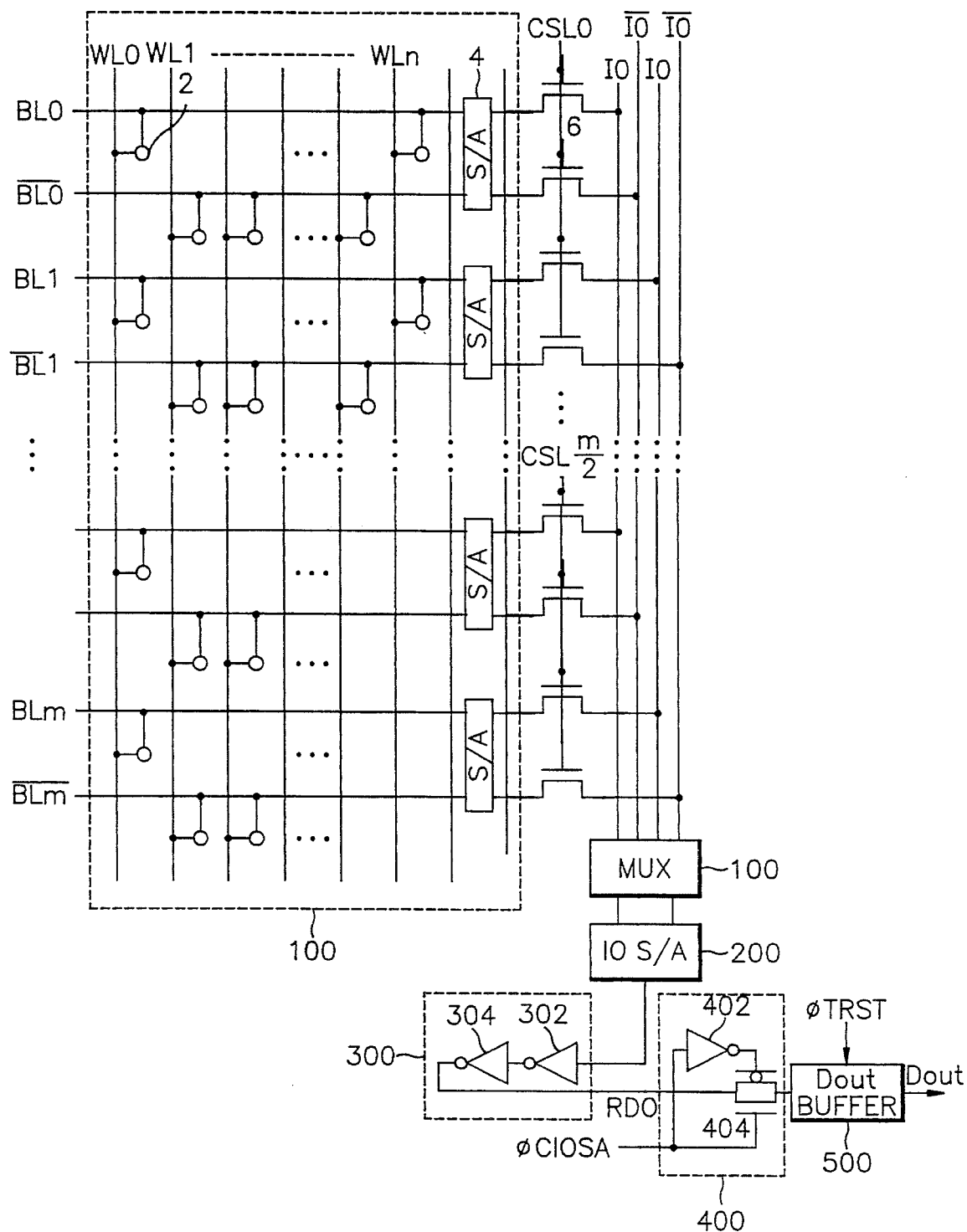
FIG. 2 is a block diagram of a semiconductor integrated circuit according to the present invention.

FIG. 2 is a block diagram showing a schematic configuration of a semiconductor integrated memory circuit according to the present invention. A cell array 100 includes a number of memory cells 2 arranged in a matrix form of rows and columns. Bit lines BLm, $\overline{\text{BLm}}$ (where m=0,1,2,...) are connected to the outputs of a corresponding row of memory cells 2. Bit line sense amplifiers 4 are each connected to a corresponding bit line, and perform a first data sensing operation. The bit lines Blm, $\overline{\text{BLm}}$ are selectively connected to data input/output lines IO, $\overline{\text{IO}}$ via m/2 column gates 6. Column gates 6 are controlled by a column selection line signal CSL. The data input/output lines IO, $\overline{\text{IO}}$ are connected to a data input/output line sense amplifier 200 through a multiplexer 10. The data input/output line sense amplifier 200 is connected to a latch circuit 300. Latch circuit 300 is composed of two inverters 302, 304 connected in series. Switching device 400 is connected between the data input/output line sense amplifier 200 and a data output buffer 500. The switching device 400 includes a transmission gate 404 controlled by a switching control signal φSCIOSA, and an inverter 402. Data output buffer 500 generates output data Dout to the exterior of the chip.

The semiconductor integrated circuit according to a presently preferred embodiment of the present invention is characterized in that, first, the input of amplified memory cell data to the data output buffer is controlled by switch 400, and second, latch circuit 300 is provided at the output of the data input/output line sense amplifier 200. This configuration extends the time during which desired data can be accurately sampled, as will be described in greater detail below.

Figure 3:
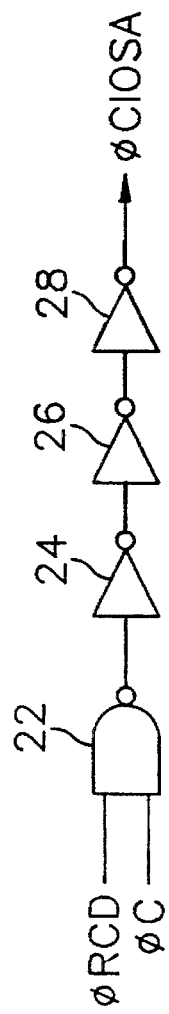
FIG. 3 is a diagram showing an example of a circuit which generates the signal φCIOSA for controlling the switching device (400) of FIG. 2.

FIG. 3 illustrates an example of a circuit which may be used to generate the signal φCIOSA for controlling the switching device 400 of FIG. 2. The circuit includes a NAND gate 22 for receiving signals φRCD and φC, and inverters 24, 26, and 28, which operate as a delaying circuit. Signals φRCD and φC are generated from row address strobe signal $\overline{\text{RAS}}$ and column address strobe signal $\overline{\text{CAS}}$. When the signals φRCD and φC are both enabled, the signal φCIOSA is also enabled. If either of the signals φRCD and φC are disabled, the signal φCIOSA is also disabled.

Figure 4:
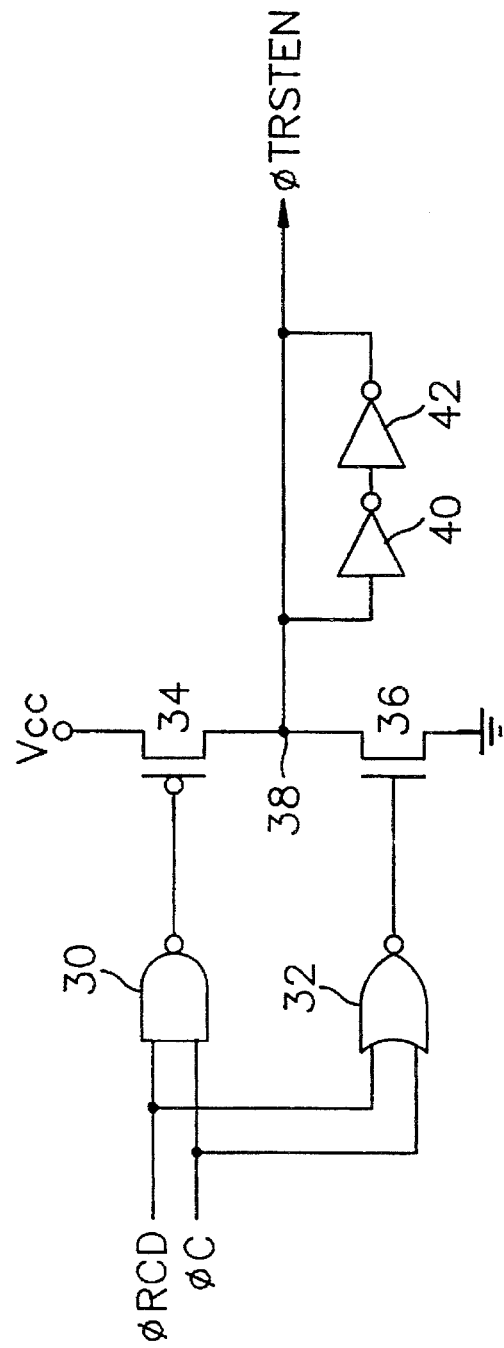
FIG. 4 is a diagram showing an example of a circuit which generates a signal φTRSTEN for enabling the signal φTRST which drives a data output buffer (500) of FIG. 2.

FIG. 4 is a diagram of a circuit which may be used to generate the signal φTRSTEN which enables signal φTRST for driving the data output buffer 500 of FIG. 2. The circuit includes a NAND gate 30 and a NOR gate 32, each of which receives the signals φRCD and φC as inputs. The circuit also includes a pull-up transistor 34 activated by the output of NAND gate 30, and a pull-down transistor 36 connected in series to the pull-up transistor 34 and activated by the output signal of the NOR gate 32. A latch circuit which includes inverters 40, 42 is connected to an output node 38 which carries the signal φTRSTEN. The signal φTRSTEN is enabled in response to the later-enabled signal of signals φRCD and φC, and then latched by the latch circuit which includes inverters 40 and 42. The signal φTRSTEN is disabled in response to the later disabled signal of signals φRCD and φC.

Figure 5:
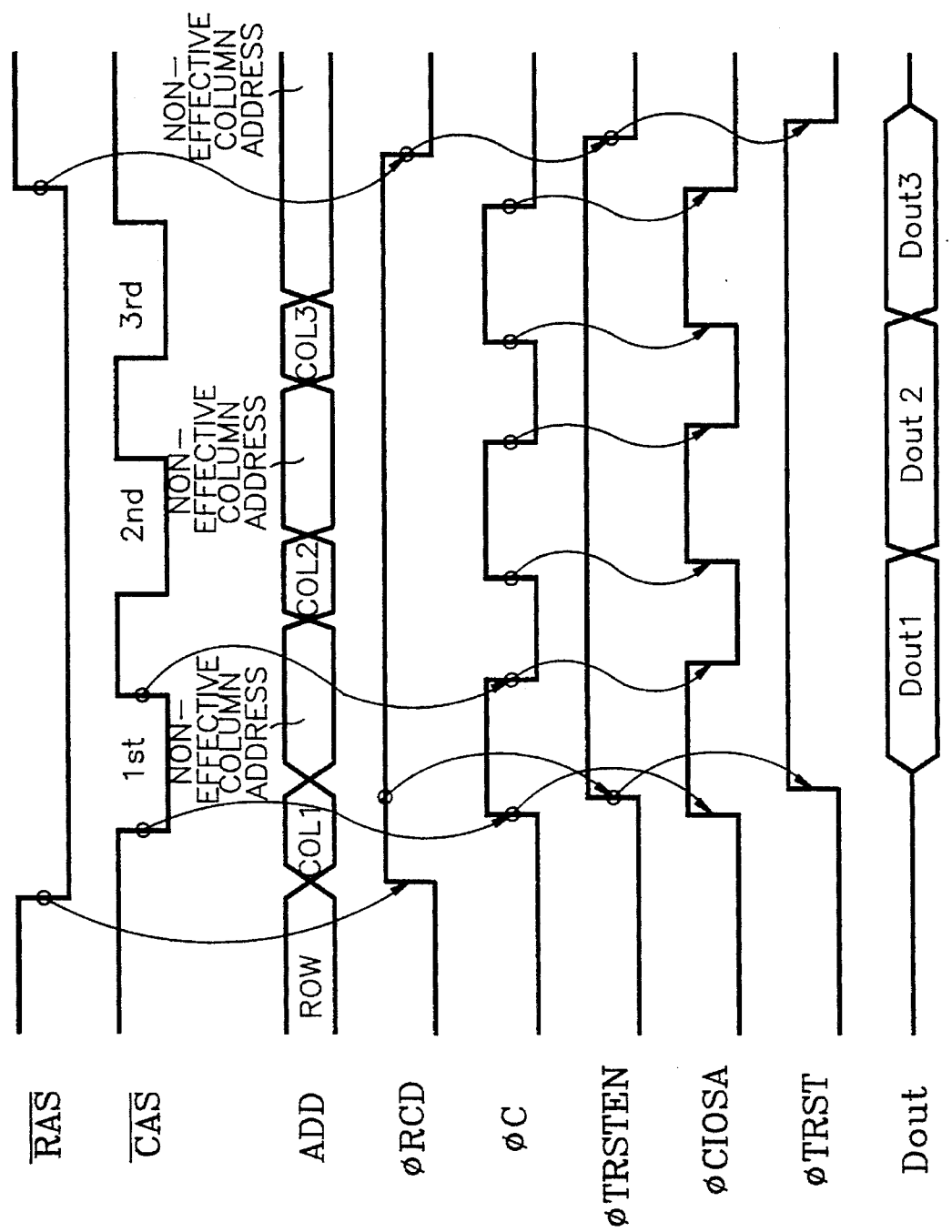
FIG. 5 is an operational timing diagram of a data read operation according to the data output extension method of the present invention.

FIG. 5 is an operational timing diagram of a data read operation performed by the circuit of FIG. 2. One of a plurality of word lines WL0-WLn (where n=1,2,3,...) is selected by a row address latched on the falling edge of row address strobe signal $\overline{\text{RAS}}$. The data stored in each memory cell connected to the selected word line are output to each bit line and sensed by an associated bit line sense amplifier 4. Then, an effective column address COL1 is latched at the falling edge of the column address strobe signal $\overline{\text{RAS}}$, and one of m/2 column selection lines CSL is selected. The selected column selection line CSL transmits data sensed by the associated bit line sense amplifiers 4 to the data input/output lines IO, $\overline{\text{IO}}$. One pair of the transmitted data on the data input/output lines IO, $\overline{\text{IO}}$ is selected by the multiplexer 100. The selected data is amplified by the data input/output line sense amplifier 200. The amplified data is latched by latch circuit 300. The data stored in the latch circuit 300 is transmitted to the data output buffer 500 through the transmission gate 404 during the interval when the signal φCIOSA is in the logic "high" state.

As shown in FIG. 5, when the level of the column address strobe signal $\overline{\text{CAS}}$ changes to enter the precharge cycle, the signal φC is synchronously disabled to the logic "low" state. As shown in FIGS. 3 and 5, the level of the signal φCIOSA also changes to the logic "low" state, thus rendering the transmission gate 404 of the switching device 400 of FIG. 2 nonconductive. As a result, the transfer of data stored in the latch circuit 300 to the data output buffer 500 is cut off, and data selected by the input of a non-effective column address is not transmitted to the data output buffer 500. Consequently, although the level of the column address strobe signal $\overline{\text{CAS}}$ changes to enter the precharge cycle, the output of the data output buffer 500 is maintained in its previous state; that is, the data which was selected by previously-input effective column address COL is still available from data output buffer 500.

As shown in FIGS. 4 and 5, the signal φTRSTEN continues to be enabled and will not be disabled before both of the signals φRCD and φC are disabled, thereby enabling the data output buffer 500 to continue outputting the correct data. Only when both signals φRCD and φC are disabled will the data output buffer 500 stop providing output. As a result, in the semiconductor integrated circuit according to the present invention, the output of the effective data is extended, and when the row address strobe signal $\overline{\text{RAS}}$ is activated, the interval of maintaining a high impedance state is greatly reduced. Therefore, the semiconductor integrated circuit according to the present invention ensures safe sampling of reliable effective data and reduces the cycle in performing the fast page mode.

It should be noted that various modifications may be made to the embodiments shown in FIGS. 2 to 4 in order to achieve the benefits of the present invention. The method for extending data output according to the present invention is easily executed in the construction of a typical semiconductor integrated circuit having a data input/output sense amplifier and a data output buffer. In particular, such a method may be effectively employed in a dynamic RAM or a video RAM.

While a presently preferred embodiment of the invention has been shown and described with particularity, it will be understood by those skilled in the art various modifications in form and details may be made without departing from the spirit and scope of the present invention, as defined by the appended claims and their equivalents.

What is claimed is:

1. A semiconductor integrated memory circuit, comprising:
    a plurality of memory cells for storing memory data, said memory cells arranged in a matrix of rows and columns, each row of memory cells connected by a bit line and each column of memory cells connected by a word line;

a plurality of bit line sense amplifiers, each bit line sense amplifier corresponding to one of said bit lines, said plurality of bit line sense amplifiers sensing memory data transmitted from one of said columns of memory cells to each of said bit lines when a word line is selected by a first memory address signal and when a row address strobe signal is in an active state;

a plurality of column select lines for selectively transmitting desired memory data sensed by said plurality of sense amplifiers to a latching circuit when a column is selected by a second memory address signal and when a column address strobe signal is in an active state;

a data output buffer for outputting said desired memory data latched by said latching circuit; and switching means interposed between said latching circuit and said data output buffer to selectively connect said latching circuit to said data output buffer in response to a control signal.

2. The semiconductor integrated memory circuit of claim 1, wherein control signal is generated in response to said row address strobe signal and said column address signal being in said active state and said switching means disconnects said latching circuit and said data output buffer when said column address strobe signal changes from said active state to an inactive state.

3. The semiconductor integrated memory circuit of claim 2, wherein said data output buffer outputs said desired memory data until said column address strobe signal returns to said active state.

4. A semiconductor integrated memory circuit, comprising:

a plurality of memory cells for storing memory data, said memory cells arranged in a matrix of rows and columns, each row of memory cells connected by a bit line and each column of memory cells connected by a word line;

a plurality of bit line sense amplifiers, each bit line sense amplifier corresponding to one of said bit lines, said plurality of bit line sense amplifiers sensing memory data transmitted from one of said columns of memory cells to each of said bit lines when a word line is selected by a first memory address signal;

a plurality of column select lines for selectively transmitting desired memory data sensed by said plurality of sense amplifiers to a data input/output line sense amplifier for amplifying said memory data when a column address strobe signal is in a first state;

a data output buffer for outputting said desired memory data amplified by said data input/output line sense amplifier; and switching means interposed between said data input/output line sense amplifier and said data output buffer for selectively providing said desired data memory from said data input/output line sense amplifier to said data output buffer in response to a first control signal.

5. The semiconductor integrated memory circuit of claim 4, wherein said switching means disconnects said data input/output line sense amplifier from said data output buffer when said column address strobe signal is in a second state.

6. The semiconductor integrated memory circuit of claim 5, wherein said data output buffer outputs said desired memory data in response to a second control signal.

7. A semiconductor integrated memory circuit, comprising:

a plurality of memory cells for storing memory data, said memory cells arranged in a matrix of rows and columns, each row of memory cells connected by a bit line and each column of memory cells connected by a word line;

a plurality of bit line sense amplifiers, each bit line sense amplifier corresponding to one of said bit lines, said plurality of bit line sense amplifiers sensing memory data transmitted from one of said columns of memory cells to each of said bit lines when a word line is selected by a first memory address signal;

a plurality of column select lines for selectively transmitting desired memory data sensed by said plurality of sense amplifiers to a data input/output line sense amplifier for amplifying said memory data when a column address strobe signal is in a first state;

data output means for outputting said desired memory data amplified by said data input/output line sense amplifier; and switching means interposed between said data input/output line sense amplifier and said data output means for selectively providing said desired data memory from said data input/output line sense amplifier to said data output means in response to a first control signal.

8. A method for extending data output for a semiconductor integrated memory circuit having a data output buffer for outputting data read out from a selected memory cell in response to a first address strobe signal and a second address strobe signal and provided to said data output buffer by way of an input/output sense amplifier, comprising the steps of:

generating a first control signal from said first address strobe signal and said second address strobe signal;

connecting said input/output sense amplifier to said data output buffer by a switching means in response to said first control signal;

disconnecting said input/output sense amplifier from said data output buffer by changing the logic state of said first control signal when said first address strobe signal is disabled;

wherein said data output buffer outputs said data until said first address strobe signal is enabled again.

9. A method for extending data output for a semiconductor integrated memory circuit, comprising the steps of:

reading out desired memory data from a memory cell in response to a first address signal;

sensing said desired memory data by a sensing means;

amplifying said desired memory data sensed by said sensing means by an amplifying means in response to a second address signal;

connecting said amplifying means to a data output buffer in response to a first control signal generated synchronously with said first and second address signals, said data output buffer outputting said desired memory data in response to a second control signal; and disconnecting said amplifying means and said data output buffer by disabling said first control signal and maintaining said second control signal.

* * * * *